US 11,938,548 B2

United States Patent
Suzuki et al.

(10) Patent No.: US 11,938,548 B2
(45) Date of Patent: Mar. 26, 2024

(54) CUTTING TOOL

(71) Applicant: Sumitomo Electric Hardmetal Corp., Itami (JP)

(72) Inventors: Yuta Suzuki, Itami (JP); Shinya Imamura, Itami (JP)

(73) Assignee: SUMITOMO ELECTRIC HARDMETAL CORP., Itami (JP)

(*) Notice: Subject to any disclaimer, the term of this patent is extended or adjusted under 35 U.S.C. 154(b) by 0 days.

(21) Appl. No.: 18/018,886

(22) PCT Filed: Jun. 15, 2022

(86) PCT No.: PCT/JP2022/023997
§ 371 (c)(1),
(2) Date: Jan. 31, 2023

(87) PCT Pub. No.: WO2023/243008
PCT Pub. Date: Dec. 21, 2023

(65) Prior Publication Data
US 2023/0405686 A1    Dec. 21, 2023

(51) Int. Cl.
*C23C 30/00* (2006.01)
*B23B 27/14* (2006.01)
(Continued)

(52) U.S. Cl.
CPC .......... *B23B 27/148* (2013.01); *C23C 14/022* (2013.01); *C23C 14/0641* (2013.01);
(Continued)

(58) Field of Classification Search
CPC ............ B23B 2224/08; B23B 2224/24; B23B 2224/32; B23B 2224/36; C23C 14/0658;
(Continued)

(56) References Cited

U.S. PATENT DOCUMENTS

2007/0259202 A1* 11/2007 Ogami ................. C23C 14/024
  204/192.16
2014/0272391 A1*  9/2014 Kumar .................... C23C 28/42
  428/457
(Continued)

FOREIGN PATENT DOCUMENTS

CN     111270202 A  *  6/2020  ......... C23C 14/0021
JP     2006334739 A  * 12/2006
(Continued)

OTHER PUBLICATIONS

Machine translation of JP 2006/334739A, obtained from JPlat-Pat service of the JPO (Year: 2023).*
Machine translation of CN 111270202A.*
Written Opinion dated Aug. 2, 2022, received for PCT Application PCT/JP2022/023997, filed on Jun. 15, 2022, 6 pages including English Translation.

*Primary Examiner* — Z. Jim Yang
(74) *Attorney, Agent, or Firm* — XSENSUS LLP

(57) ABSTRACT

A cutting tool comprising a base material and a coating, wherein the coating includes a first layer having a multilayer structure in which a first unit layer and a second unit layer are alternately stacked; a thickness of the first unit layer is 2 to 50 nm; a thickness of the second unit layer is 2 to 50 nm; a thickness of the first layer is 1.0 μm or more and 20 μm or less, the first unit layer is composed of $Ti_aAl_bB_cN$, and the second unit layer is composed of $Ti_dAl_eB_fN$, wherein $0.49 \leq a \leq 0.70$, $0.19 \leq b \leq 0.40$, $0.10 \leq c \leq 0.20$, $a+b+c=1.00$, $0.39 \leq d \leq 0.60$, $0.29 \leq e \leq 0.50$, $0.10 < f \leq 0.20$, $d+e+f=1.00$, $0.05 \leq a-d \leq 0.20$, and $0.05 \leq e-b \leq 0.20$ are satisfied, and a percentage of the number of atoms of titanium to the total number of atoms of titanium, aluminum and boron is 45% or more in the first layer.

3 Claims, 3 Drawing Sheets

(51) Int. Cl.
*C23C 14/02* (2006.01)
*C23C 14/06* (2006.01)
*C23C 14/32* (2006.01)
*C23C 14/50* (2006.01)
*C04B 41/50* (2006.01)

(52) U.S. Cl.
CPC ........ *C23C 14/0647* (2013.01); *C23C 14/325* (2013.01); *C23C 14/505* (2013.01); *C23C 30/005* (2013.01); *B23B 2224/24* (2013.01); *B23B 2228/105* (2013.01); *C04B 41/5063* (2013.01); *C04B 41/5068* (2013.01)

(58) Field of Classification Search
CPC ............ C23C 14/0664; C23C 14/0641; C23C 14/0647; C23C 16/34; C23C 16/342; C23C 16/347; C23C 16/36; C23C 30/005; C23C 28/04–44; C04B 41/5062; C04B 41/5063; C04B 41/5064; C04B 41/5068
See application file for complete search history.

(56) References Cited

U.S. PATENT DOCUMENTS

| | | | |
|---|---|---|---|
| 2015/0225840 A1* | 8/2015 | Andersson | ............ C23C 14/021 204/192.16 |
| 2018/0099335 A1* | 4/2018 | Takeshita | ............ C23C 14/0641 |
| 2019/0160546 A1 | 5/2019 | Misumi et al. | |
| 2020/0370173 A1 | 11/2020 | Kido et al. | |

FOREIGN PATENT DOCUMENTS

| | | |
|---|---|---|
| JP | 2007-38378 A | 2/2007 |
| JP | 2011-224671 A | 11/2011 |
| JP | 2011-224717 A | 11/2011 |
| JP | 2017-193004 A | 10/2017 |
| WO | 2019/181136 A1 | 9/2019 |

\* cited by examiner

CUTTING TOOL

CROSS-REFERENCE TO RELATED APPLICATION

The present application is based on PCT filing PCT/JP2022/023997, filed Jun. 15, 2022, the entire contents of which are incorporated herein by reference.

TECHNICAL FIELD

The present disclosure relates to a cutting tool.

BACKGROUND ART

Conventionally, coatings that coat a surface of a base material made of cemented carbide, sintered cubic boron nitride and the like have been developed in order to improve performance of cutting tools (for example, Patent Literature 1 and Patent Literature 2).

CITATION LIST

Patent Literature

PTL 1: Japanese Patent Laying-Open No. 2017-193004
PTL 2: Japanese Patent Laying-Open No. 2011-224717

SUMMARY OF INVENTION

The cutting tool of the present disclosure is a cutting tool comprising a base material and a coating arranged on the base material, wherein
the coating includes a first layer;
the first layer has a multilayer structure in which a first unit layer and a second unit layer are alternately stacked;
a thickness of the first unit layer is 2 nm or more and 50 am or less;
a thickness of the second unit layer is 2 nm or more and 50 nm or less;
a thickness of the first layer is 1.0 μm or more and 20 μm or less,
the first unit layer is composed of $Ti_aAl_bB_cN$, and
the second unit layer is composed of $Ti_dAl_eB_fN$,
wherein
$0.49 \leq a \leq 0.70$,
$0.19 \leq b \leq 0.40$,
$0.10 < c \leq 0.20$,
$a+b+c=1.00$,
$0.39 \leq d \leq 0.60$,
$0.29 \leq e \leq 0.50$,
$0.10 \leq f \leq 0.20$,
$d+e+f=1.00$,
$0.05 \leq a-d \leq 0.20$, and
$0.05 \leq e-b \leq 0.20$ are satisfied, and
a percentage of the number of atoms of titanium to the total number of atoms of titanium, aluminum and boron is 45% or more in the first layer.

DETAILED DESCRIPTION

Figure 1:
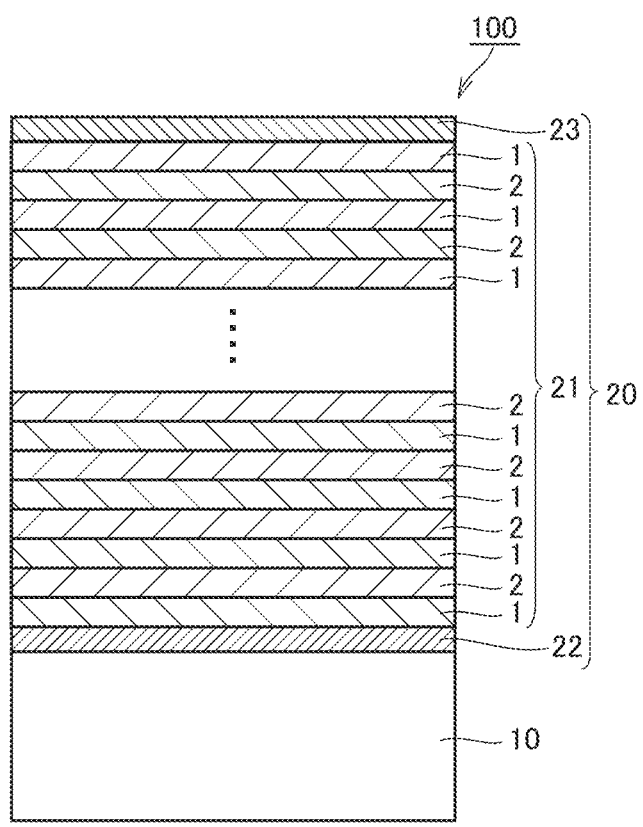
FIG. 1 is a schematic cross-sectional view illustrating an example of the configuration of the cutting tool according to one embodiment of the present disclosure.

Problem to be Solved by the Present Disclosure

In recent years, cost reduction of tools has been increasingly demanded, and the tools have been required for their longer lives. For example, in turning of stainless steel, a cutting tool that hardly poses crater wear due to welding and has a long tool life, has been demanded.
Then, an object of the present disclosure is to provide a cutting tool with a long tool life.

Advantageous Effect of the Present Disclosure

The cutting tool of the present disclosure can have a long tool life.

Description of Embodiments

First, aspects of the present disclosure will be described by listing them.
(1) The cutting tool of the present disclosure is a cutting tool comprising a base material and a coating arranged on the base material, wherein
the coating includes a first layer;
the first layer bas a multilayer structure in which a first unit layer and a second unit layer are alternately stacked;
a thickness of the first unit layer is 2 nm or more and 50 nm or less,
a thickness of the second unit layer is 2 nm or more and 50 nm or less;
a thickness of the first layer is 1.0 μm or more and 20 μm or less,
the first unit layer is composed of $Ti_aAl_bB_cN$, and
the second unit layer is composed of $Ti_dAl_eB_fN$,
wherein
$0.49 \leq a \leq 0.70$,
$0.19 \leq b \leq 0.40$,
$0.10 < c \leq 0.20$,
$a+b+c=1.00$,
$0.39 \leq d \leq 0.60$,
$0.29 \leq e \leq 0.50$,
$0.10 \leq f \leq 0.20$,
$d+e+f=1.00$,
$0.05 \leq a-d \leq 0.20$, and
$0.05 \leq e-b \leq 0.20$ are satisfied, and
a percentage of the number of atoms of titanium to the total number of atoms of titanium, aluminum and boron is 45% or more in the first layer.
The cutting tool of the present disclosure can have a long tool life.
(2) In (1) above, a coefficient of friction of the first layer for carbon steel S50C at 25° C. is preferably 0.50 or less. Accordingly, the first layer has excellent surface lubricity, thereby inhibiting a workpiece from welding to the cutting tool, inhibiting wear (crater wear) due to the welling, and improving a tool life.
(3) In (1) or (2) above, nanoindentation hardness H of the first layer at 25° C. is preferably 25 GPa or greater. Accordingly, the wear resistance of the cutting tool is improved.

Details of Embodiments of the Present Disclosure

Specific examples of the cutting tool of the present disclosure will be described with reference to the drawings below. In the drawings of the present disclosure, the same reference sign represents the same portion or equivalent portion. Moreover, dimensional relationships such as length, width, thickness, and depth have been changed as necessary for the sake of clarity and simplification of the drawings, and do not necessarily represent actual dimensional relationships.

In the present disclosure, the notation in the form "A to B" refers to the upper limit and lower limit of the range (i.e., A or more and B or less). In a case in which no units are described in A, but only in B, the units in A are the same as that in B.

Compounds and the like when represented by chemical formulae in the present disclosure shall include all conventionally known atomic ratios as long as the atomic ratios thereof and not particularly limited, and should not necessarily be limited only to those in their stoichiometric ranges. For example, when described as "TiN", the ratio of the number of atoms constituting TiN includes all conventionally known atomic ratios.

In the present disclosure, when each of one or more numerical values is described as lower limits and upper limits of a numerical range, combinations of any one numerical value described for the lower limit and any one numerical value described for the upper limit shall also be disclosed. For example, when a1 or more, b1 or more, or c1 or more is described as the lower limit, and a2 or less, b2 or less, and c2 or less as the upper limit, a1 or more and a2 or less, a1 or more and b2 or less, a1 or more and c2 or less, and b1 or more and a2 or less, b1 or more and to b2 or less, b1 or more and c2 or less, c1 or more and a2 or less, and c1 or more and b2 or less, and c1 or more and c2 or less, shall be disclosed.

Embodiment 1: Cutting Tool

The cutting tool of one embodiment of the present disclosure (hereinafter also referred to as "present embodiment") is a cutting tool comprising a base material and a coating arranged on the base material, wherein
the coating includes a first layer;
the first layer has a multilayer structure in which a first unit layer and a second unit layer are alternately stacked;
a thickness of the first unit layer is 2 nm or more and 50 nm or less;
a thickness of the second unit layer is 2 nm or more and 50 nm or less;
a thickness of the first layer is 1.0 µm or more and 20 µm or less,
the first unit layer is composed of $Ti_aAl_bB_cN$, and
the second unit layer is composed of $Ti_dAl_eB_fN$,
wherein
$0.49 \leq a \leq 0.70$,
$0.19 \leq b \leq 0.40$,
$0.10 < c \leq 0.20$,
$a+b+c=1.00$,
$0.39 \leq d \leq 0.60$,
$0.29 \leq e \leq 0.50$,
$0.10 \leq f \leq 0.20$,
$d+e+f=1.00$,
$0.05 \leq a-d \leq 0.20$, and
$0.05 \leq e-b \leq 0.20$ are satisfied, and
a percentage of the number of atoms of titanium to the total number of atoms of titanium, aluminum and boron is 45% or more in the first layer.

The cutting tool of the present disclosure can have a long tool life. The reason therefore is conjectured as follows.

(i) The coating of the cutting tool of the present disclosure includes a first layer having a multilayer structure in which the first unit layer and the second unit layer are alternately stacked. The composition of the first unit layer and that of the second unit layer are different from each other. This enables to inhibit propagation of cracks occurring from a surface of the coating in the vicinity of an interface between the first unit layer and the second unit layer upon using the cutting tool. Moreover, the thickness of each of the first unit layer and the second unit layer, which is very small and 2 nm or more and 50 nm or less, allows the first layer and second layer in a large number to be stacked, thereby further enhancing inhibition effect of crack propagation. Therefore, large scale damage to the coating can be inhibited, thereby prolonging a tool life of the cutting tool.

(ii) In the first layer described above, the composition of the first unit layer and that of the second unit layer are different enough to inhibit crack propagation as described in (i) above as well as are similar to the extent that allows the crystal lattice to be continuous, as a result of which the first unit layer and the second unit layer are inhibited for delaminating therebetween, thereby prolonging a tool life of the cutting tool.

(iii) In the above first layer, a percentage of the number of atoms of titanium (Ti) to the total number of atoms of titanium, aluminum and boron (Ti+Al+B), which is {Ti/(Ti+Al+B)}×100, is 45% or more. According thereto, the first layer can have excellent the wear resistance.

(iv) In the above first layer, a percentage of the number of atoms of boron (B) to the total number of atoms of titanium, aluminum and boron (Ti+Al+B), which is {B/(Ti+Al+B)}×100, is more than 10%. According thereto, hexagonal boron nitride is formed on a surface of the first layer upon using the cutting tool. The hexagonal boron nitride functions as a solid lubricant and imparts surface lubricity to the first layer, which therefore inhibits the workpiece from welding to the cutting tool and inhibits wear (crater wear) due to the welding from occurring, thereby improving the tool life.

Incidentally, in the TiAlBN layer, the more the percentage of the number of atoms of boron (B) to the total number of atoms of titanium, aluminum and boron (Ti+Al+B), which is {B/(Ti+Al+B)}×100, the lower the hardness tends to be. Therefore, conventionally, a TiAlBN layer with a percentage of {B/(Ti+Al+B)}×100, which is more than 10% has not been used as a coating of a cutting tool. The present inventors newly have found, as a result of diligent investigation that the first unit layer and the second unit layer each having the above composition, which are alternately stacked at the above thickness to form the first layer, improve the surface lubricity while inhibiting reduction of the hardness of the first layer, thereby inhibiting wear (crater wear) due to wear accompanying the hardness reduction and wear due to welding from occurring, thereby improving a tool life.

<Cutting Tool>

A shape, application and the like of the cutting tool of the present embodiment are not particularly limited as long as it is a cutting tool. The cutting tool of the present embodiment can be, for example, drills, end mills, replacement blade inserts for milling, replacement blade inserts for turning, metal saws, gear cutting tools, reamers, taps, inserts for pin milling of crankshafts, or the like.

FIG. 1 is a schematic partial cross-sectional view illustrating an example of the configuration of the cutting tool of the present embodiment. A cutting tool 100 comprises a base material 10 and a coating 20 arranged on base material 10.

<<Base Material>>

Base material 10 is not particularly limited. Base material 10 can be configured of, for example, such as cemented carbide, cermet, high-speed steel, ceramics, a cubic boron nitride sintered material, and a diamond sintered material. Base material 10 is preferably made of cemented carbide. This is because the cemented carbide has excellent wear resistance.

Cemented carbide is a sintered material composed mainly of WC (tungsten carbide) particles. The cemented carbide includes a hard phase and a binder phase. The hard phase contains WC particles. The binder phase bonds the WC particles to each other. The binder phase contains, for example, Co (cobalt) and the like. The binder phase may further contain, for example, TiC (titanium carbide), TaC (tantalum carbide), NbC (niobium carbide), or the like.

The cemented carbide may contain impurities that are unavoidably mixed in during a manufacturing process. The cemented carbide may also contain free carbon or an anomalous layer referred to as "η-layer" in the microstructure. Furthermore, the cemented carbide may undergo surface modification treatment. For example, the cemented carbide may contain a β-free layer or the like on a surface thereof.

The cemented carbide preferably contains 87% by mass or more and 96% by mass or less of WC particles and contains 4% by mass or more and 13% by mass or less of Co. The WC particle preferably has an average particle size of 0.2 µm or larger and 4 µm or smaller.

Co is softer than the WC particle. As will be described below, soft Co can be removed by ion bombardment treatment on a surface of base material 10. With cemented carbide having the aforementioned composition and the WC particle having the aforementioned average particle size, moderate convex and concave will be formed on a surface after Co was removed. Coating 20 formed on such a surface is considered to exhibit an anchor effect, thereby improving adhesiveness between coating 20 and base material 10.

Here, the particle size of the WC particle indicates the diameter of a circle circumscribed by a two-dimensional projected image of the WC particle. The particle size is determined with a scanning electron microscope (SEM) or a transmission electron microscope (TEM). Namely, cemented carbide is cut, and the cut surface is observed by SEM or TEM. The diameter of the circle circumscribed to the WC particle in an observed image is regarded as the particle diameter of the WC particle. In the observed image, the diameters of 10 or more (preferably 50 or more and more preferably 100 or more) of WC particles selected at random in the observed image are measured, and the arithmetic mean value thereof is considered to be an average particle diameter of the WC particles. Upon the observation, the cut surface is desirably subjected to cross-section processing by a cross-section polisher (CP) or focused ion beam (FIB) or the like.

<<Coating>>

Coating 20 is arranged on base material 10. Coating 20 may be arranged on a portion of a surface of base material 10 or on the entire surface thereof. However, coating 20 shall be arranged on at least a portion of the surface of base material 10, which corresponds to a cutting edge.

Coating 20 includes a first layer 21. Coating 20 may include other layers as long as it includes first layer 21. For example, coating 20 may include a second layer 22 arranged between base material 10 and first layer 21 and/or a third layer 23 arranged on the top surface of coating 20. A publicly known underlying layer can be applied to the second layer. Examples of the underlying layer include a TiCN layer, a TiN layer, a TiCNO layer, or the like. A publicly known surface layer can be applied to the third layer. The surface layers include a TiC layer, TiN layer, TiCN layer, or the like.

The stacked configuration of coatings 20 is not necessarily uniform throughout the entire coating 20, and may partially be different.

The thickness of coating 20 is preferably 1.0 µm or more and 25 µm or less. Coating 20 having a thickness of 1.0 µm or more improves the wear resistance. Coating 20 having a thickness of 25 µm or less improves the chipping resistance. The thickness of coating 20 is preferably 1.0 µm or more and 25 µm or less, more preferably 2.0 µm or more and 16 µm or less, and still more preferably 3.0 µm or more and 12 µm or less. Here, the thickness of the coating refers to the total summation of each thickness of the layers constituting the coating. Examples of the "layer constituting the coating" include, for example, first layer, second layer, third layer, and the like.

The thickness of each layer constituting the coating is determined by obtaining a thin sample (hereinafter also referred to as "cross-sectional sample") of a cross-section parallel to the normal direction of the surface of the base material of the cutting tool and observing the cross-sectional sample with a scanning transmission electron microscope (STEM). Examples of the scanning transmission electron microscope include, for example, a JEM-2100F (trade name) manufactured by JEOL Ltd. Observation magnification of the cross-sectional sample is set at 5,000 to 10,000 times, thicknesses of each layer are measured at five locations thereof, and an arithmetic mean of the thicknesses is used as the "thickness of each layer."

It has been confirmed that as long as the same cutting tool is used for measurement, there is no variation in measurement results even though a measurement location is arbitrarily selected.

In the present embodiment, a crystal grain constituting coating 20 is preferably a cubic crystal. The cubic crystal increases hardness and prolongs a tool life.

<<First Layer>>

A first layer 21 has a multilayer structure in which first unit layer 1 and second unit layer 2 are alternately stacked. As long as first layer 21 includes one or more of first unit layers 1 and one or more of second unit layers 2, respectively, the number of stacking is not limited. The number of stacking indicates the total number of first unit layer 1 and second unit layer 2, included in first layer 21. The number of stacking is preferably more than 10 and 5,000 or less, preferably 200 or more and 5,000 or less, more preferably 400 or more and 2,000 or less, and still more preferably 500 or more and 1,000 or less. In first layer 21, the layer closest to base material 10 may be first unit layer 1 or second unit layer 2. Moreover, in first layer 21, the layer farthest from base material 10 may be first unit layer 1 or second unit layer 2.

The thickness of the first layer is 1.0 µm or more and 20 µm or less. The first layer having a thickness of 1.0 µm or more improves the wear resistance. The first layer having a thickness of 20 µm or less improves the chipping resistance. The lower limit of the thickness of the first layer is preferably 1.0 µm or more, more preferably 2.0 µm or more, and still more preferably 3.0 µm or more. The upper limit of the thickness of the first layer is preferably 20 µm or less, preferably 18 µm or less, more preferably 16 µm or less, and still more preferably 12 µm or less. The thickness of the first layer is 1.0 µm or more and 20 µm or less, preferably 2.0 µm or more and 16 µm or less, and more preferably 3.0 µm or more and 12 µm or less.

<<Thicknesses of First Unit Layer and Second Unit Layer>>

First unit layer 1 and second unit layer 2 each have a thickness of 2 nm or more and 50 nm or less. Such thin layers alternately stacked enable to inhibit propagation of cracks. The thickness of each of first unit layer 1 and second unit layer 2 being less than 2 nm has a possibility to reduce the inhibition effect of crack propagation due to mixing of the compositions of first unit layer 1 and second unit layer 2. Moreover, the thickness of each of first unit layer 1 and second unit layer 2 exceeding 50 nm may reduce the inhibition effect of interlayer delamination.

The lower limit of the thickness of the first unit layer is 2 nm or more, preferably 4 nm or more, more preferably 6 nm or more, and still more preferably 8 nm or more. The upper limit of the thickness of the first unit layer is 50 nm or less, preferably 42 nm or less, preferably 40 nm or less, and more preferably 30 nm or less. The thickness of the first unit layer is 2 nm or more and 50 nm or less, preferably 4 nm or more and 40 nm or less, and more preferably 6 nm or more and 30 nm or less.

The lower limit of the thickness of the second unit layer is 2 nm or more, preferably 4 nm or more, more preferably 6 nm or more, and still more preferably 8 nm or more. The upper limit of the thickness of the second unit layer is 50 nm or less, preferably 40 nm or less and more preferably 30 nm or less. The thickness of the second unit layer is 2 nm or more and 50 nm or less, preferably 4 nm or more and 40 nm or less, and more preferably 6 nm or more and 30 nm or less.

The respective thicknesses of the first unit layer and the second unit layer are measured as follows. A thin sample (hereinafter also referred to as "cross-sectional sample") of a cross-sectional section of the cutting tool parallel to the normal direction of a surface of the base material is obtained. Then the cross-sectional sample is observed with a scanning transmission electron microscope (STEM). Examples of the scanning transmission electron microscope include, for example, a JEM-2100F (trade name) manufactured by JEOL Ltd. Observation magnification of the cross-sectional sample shall be adjusted according to the thicknesses of first unit layer 1 and second unit layer 2. For example, the observation magnification can be approximately 1 million times. In one first unit layer, thicknesses are measured at five locations thereof. An arithmetic mean value of the thicknesses of the five locations in the first unit layer is calculated to determine the thickness of the first unit layer that is the arithmetic mean value. In one second unit layer, thicknesses are measured at five locations thereof.

For each of the five different first unit layers, the thickness of the first unit layer is measured according to the procedure described above. An arithmetic mean value of the thicknesses of the five first unit layers is determined. The arithmetic mean value is taken as the thickness of the first unit layer. For each of the five different second unit layers, the thickness of the second unit layer is measured according to the procedure described above. An arithmetic mean value of the thicknesses of the five second unit layers is determined. The arithmetic mean value is taken as the thickness of the second unit layer.

It has been confirmed that there is no variation in the measurement results even though the measurement location is arbitrarily selected, as long as measuring with the same cutting tool.

<<Compositions of First Unit Layer and Second Unit Layer>>

The first unit layer is composed of $Ti_aAl_bB_cN$, and the second unit layer is composed of $Ti_dAl_eB_fN$, wherein $0.49 \leq a \leq 0.70$, $0.19 \leq b \leq 0.40$, $0.10 < c \leq 0.20$, $a+b+c=1.00$, $0.39 \leq d \leq 0.60$, $0.29 \leq e \leq 0.50$, $0.10 < f \leq 0.20$, $d+e+f=1.00$, $0.05 \leq a-d \leq 0.20$, and $0.05 \leq e-b \leq 0.20$, are satisfied.

The compositions of the first unit layer and the second unit layer that satisfy $0.05 \leq a-d$ and $0.05 \leq e-b$, allow the compositions of the first unit layer and the second unit layer to be diverged to the extent that cracks between first unit layer 1 and second unit layer 2 can be inhibited from propagating. At the same time, satisfying $a-d \leq 0.20$ and $e-b \leq 0.20$ allows the compositions of the first unit layer and the second unit layer to be approximated to the extent that interlayer delamination between first unit layer 1 and second unit layer 2 can be inhibited. The compositions of first unit layer 1 and second unit layer 2 preferably satisfy the relationship $0.05 \leq a-d \leq 0.15$ and $0.05 \leq e-b \leq 0.15$ and more preferably $0.05 \leq a-d \leq 0.10$ and $0.05 \leq e-b \leq 0.10$. This further improves the inhibition effects of crack propagation and interlayer delamination.

In the first unit layer, the lower limit of "a" is 0.49 or more, preferably 0.52 or more and more preferably 0.55 or more. The upper limit of "a" is 0.70 or less, preferably 0.67 or less, and, more preferably 0.64 or less. "a" preferably satisfies $0.52 \leq a \leq 0.67$ and more preferably $0.55 \leq a \leq 0.64$.

In the first unit layer, the lower limit of "b" is 0.19 or more, preferably 0.22 or more, and more preferably 0.25 or more. The upper limit of "b" is 0.40 or less, preferably 0.37 or less, and more preferably 0.34 or less. "b" preferably satisfies $0.22 \leq b \leq 0.37$ and more preferably $0.25 \leq b \leq 0.34$.

In the second unit layer, the lower limit of "d" is 0.39 or more, preferably 0.42 or more, and more preferably 0.45 or more. The upper limit of "d" is 0.60 or less, preferably 0.57 or less, and more preferably 0.54 or less. "d" preferably satisfies $0.42 \leq d \leq 0.57$ and more preferably $0.45 \leq d \leq 0.54$.

In the second unit layer, the lower limit of "e" is 0.29 or more, preferably 0.32 or more, and more preferably 0.35 or more. The upper limit of "e" is 0.50 or less, preferably 0.47 or less, and more preferably 0.54 or less. "e" preferably satisfies $0.32 \leq e \leq 0.47$ and more preferably $0.35 \leq e \leq 0.54$.

Satisfying $0.10 < e \leq 0.20$ in the first unit layer and $0.10 < f \leq 0.20$ in the second unit layer improves the surface lubricity of the first layer. This, therefore, inhibits the workpiece from welding to the cutting tool and inhibits wear (crater wear) due to the welding from occurring, thereby improving a tool life.

In the first unit layer, the lower limit of "c" is more than 0.10, preferably 0.11 or more and more preferably 0.12 or more. The upper limit of "c" is 0.20 or less, preferably 0.19 or less, and more preferably 0.18 or less. "c" preferably satisfies $0.11 \leq c \leq 0.19$ and more preferably $0.12 \leq c \leq 0.18$.

In the second unit layer, the lower limit of "f" is more than 0.10, preferably 0.11 or more and more preferably 0.12 or more. The upper limit of "f" is 0.20 or less, preferably 0.19 or less, and more preferably 0.18 or less. "f" preferably satisfies $0.11 \leq f \leq 0.19$ and more preferably $0.12 \leq f \leq 0.18$.

The subscripts of a b, c in $Ti_aAl_bB_cN$ of the first unit layer, and d, e, f in $Ti_dAl_eB_fN$ of the second unit layer were identified by measuring the composition of each layer by energy dispersive X-ray spectrometry (EDX). A TEM-EDX is used for composition analysis. Examples of the EDX apparatus include a JED-2300 (trade name) manufactured by JEOL Ltd.

The above composition analysis is conducted by the following procedure. A thin sample (hereinafter referred to as "cross-sectional sample") of a cross-section parallel to the normal direction of a surface of the base material of the cutting tool is obtained. While observing the cross-sectional sample with TEM, EDX analysis is conducted at five points arbitrarily selected within one first unit layer 1 or one second unit layer 2. The first unit layer and the second unit layer are distinguishable due to difference in contrast. Here, the "five points arbitrarily selected" shall be selected from grains that differ from each other. The composition of each of the first unit layer and the second unit layer is identified by arithmetically averaging composition ratios of each element, obtained from the five measurements.

Compositions of five layers of each of the first unit layer and the second unit layer are analyzed and the second unit layer, and an average composition of the first unit layer for the five layers and an average composition of the second unit layer for the five layers are determined, respectively. The average composition of the first unit layer for the five layers is taken as a composition of the first unit layer; and the average composition of the second unit layer for the five layers is taken as a composition of the second unit layer. Based on these compositions, a, b, c, d, e, and f are identified.

As long as the measurement is carried out on the same cutting tool, it has been confirmed that there is no variation in the measurement results even though measurement points are arbitrarily selected.

<<Composition of First Layer>>

In the first layer, the percentage of the number of atoms of titanium to the total number of atoms of titanium, aluminum and boron (hereinafter also referred to as "titanium content in the first layer") is 45% or more. Accordingly, the first layer can have excellent wear resistance. The lower limit of the titanium content in the first layer is 45% or more from the viewpoint of improving the wear resistance, preferably 48% or more, and more preferably 51% or more. The upper limit of the titanium content in the first layer is preferably 65% or less and more preferably 60% or less from the viewpoint of improving heat resistance. The titanium content in the first layer is preferably 45% or more and 65% or less, more preferably 48% or more and 65% or less, and still more preferably 51% or more and 60% or less.

The titanium content in the first layer is measured by TEM-EDX. Examples of an EDX apparatus includes an apparatus such as a JED-2300 (trade name) manufactured by JEOL Ltd. The titanium content in the first layer is measured by the following procedure.

A thin sample (hereinafter also referred to as "cross-sectional sample") of a cross-section parallel to the normal direction of a surface of the base material of the cutting tool is obtained. While observing the cross-sectional sample by TEM, EDX analysis is carried out at five fields of view arbitrarily selected within the first layer. Here, "five fields of view arbitrarily selected" are set so as not to overlap with each other. The range of one field of view is 200×200 nm. The arithmetic mean of the titanium content values obtained from the measurements of the five fields of view is taken as the titanium content of the first layer.

It has been confirmed that as long as the same cutting tool is used for measurement, there is no variation in measurement results even though a measurement point is arbitrarily selected.

<<Coefficient of Friction for Carbon Steel S50 in First Layer>>

The coefficient of friction of the first layer for carbon steel S50C at 25° C. is preferably 0.50 or less. According thereto, the first layer has excellent surface lubricity. Therefore, the workpiece is inhibited from welding to the cutting tool and wear (crater wear) due to the welding is inhibited from occurring, thereby improving the tool life.

The upper limit of the above coefficient of friction is preferably 0.50 or less, more preferably 0.45 or less, and still more preferably 0.40 or less. The lower limit of the above coefficient of friction is not particularly limited, and can be, for example, 0.10 or more. The above coefficient of friction is preferably 0.10 or more and 0.50 or less, more preferably 0.10 or more and 0.45 or less, and still more preferably 0.10 or more and 0.40 or less. The above coefficient of friction refers to a coefficient of kinetic friction.

The above coefficient of friction is measured by the following procedure. First, a surface of the first layer is washed with acetone. In a case in which other layer is formed on the first layer, the other layer is removed by parallel polishing and lapping to expose a first layer, and then a surface of the first layer is washed with acetone.

On a surface of the first layer after washing, a coefficient of friction test is carried out by a ball-on-disk method, using a high temperature tribometer manufactured by Anton Paar GmbH, and a coefficient of friction is measured. The coefficient of friction test is conducted under the following conditions.

Coefficient of friction test conditions
Platy test piece: Test piece including the first layer prepared above
Spherical test piece (counterpart material): φ 6 mm carbon steel S50C ball
Load: 1 N
Sliding speed: 5.2 m/min
Temperature: 25° C.
Sliding time: 5 minutes The coefficient of friction value measured is displayed on the above high temperature tribometer.

It has been confirmed that there is no variation in the measurement results even though a measurement point is arbitrarily selected, as long as the measurement is carried out on the same cutting tool. The above coefficient of friction test uses carbon steel S50C as the counterpart material, however, the above coefficient of friction test using a spherical test piece made of a material other than stainless steel S50C, such as SS400 or the like confirms that a coefficient of friction of the first layer of the present embodiment is small.

<<Nanoindentation Hardness of First Layer>>

Nanoindentation hardness H of the first layer at 25° C. is preferably 25 GPa or greater. Accordingly, the wear resistance of the cutting tool is improved. The lower limit of nanoindentation hardness H is preferably 25 GPa or greater, more preferably 28 GPa or greater, and still more preferably 30 GPa or greater. The upper limit of nanoindentation hardness H is not particularly limited, and can be 55 GPa or smaller from the viewpoint on manufacturing. Nanoindentation hardness H of the first layer at 25° C. is preferably 25 GPa or greater and 55 GPa or smaller, 28 GPa or greater and 55 GPa or smaller, and still more preferably 30 GPa or greater and 55 GPa or smaller.

Nanoindentation hardness H of the above first layer at 25° C. is calculated by a nanoindentation method complied with the standard procedure set forth in "ISO 14577-1:2015 Metallic materials-Instrumented indentation test for hardness and materials parameters." A measurement apparatus that is an "ENT-1100a" manufactured by Elionix Inc., is used. An indentation load of an indenter is 1 g. Indentation of the indenter is conducted along a cross-section of the first layer in the vertical direction (i.e., parallel to a surface of the base material) for the first layer exposed in the cross-section parallel to the normal direction of the surface of the base material.

The aforementioned measurement is conducted for five measurement samples, and an average value of the nanoindentation hardness obtained for each sample is taken as nanoindentation hardness of the first layer. Data that appear to be anomalous values at first glance shall be excluded.

It has been confirmed that as long as the same cutting tool is used for measurement, there is no variation in measurement results even though a measurement point is arbitrarily selected.

Embodiment 2: Method for Manufacturing Cutting Tool

In Embodiment 2, a method for manufacturing the cutting tool of Embodiment 1 will be described. The manufacturing method can include a step of preparing a base material and a step of forming a coating on the base material. Details of each step will be described below.

<<Step of Preparing Base Material>>

In the step of preparing a base material, a base material 10 is prepared. Base material 10 that is the base material described in Embodiment 1 can be used.

<<Step of Forming a Coating>>

In the step of forming a coating, a film 20 is formed on base material 10. In the present embodiment, a physical vapor deposition (PVD) method can be employed to form film 20. Examples of the PVD method include an Arc Ion Plating (AIP) method, a balanced magnetron sputtering (BMS) method, and an unbalanced magnetron sputtering (UBMS) method, and the like. In the present embodiment, the arc ion plating method is preferred.

In the AIP method, an arc discharge is generated with a target material as a cathode. This evaporates and ionizes the target material. Ions are then deposited on a surface of base material 10 to which a negative bias voltage is applied. The AIP method is superior in ionization rate of the target material.

Figure 2:
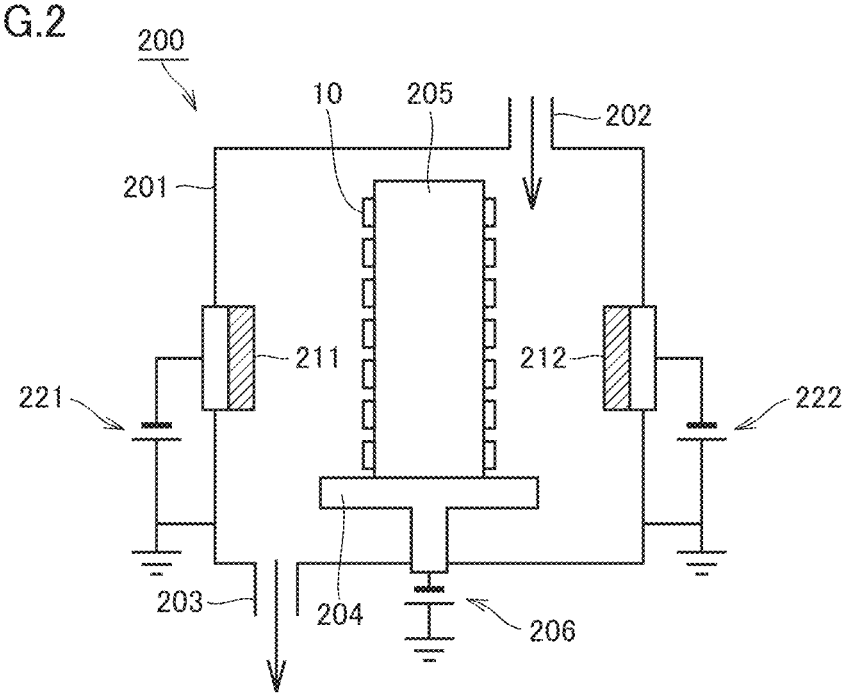
FIG. 2 is a schematic cross-sectional view illustrating an example of the configuration of a film deposition apparatus.

A deposition apparatus used in the AIP method will be described using FIGS. 2 and 3. As shown in FIG. 2, a deposition apparatus 200 is equipped with a chamber 201. Chamber 201 has a gas inlet port 202 for introducing a raw material gas to chamber 201 and a gas exhaust port 203 for discharging the material gas from inside chamber 201 to an outside. Gas exhaust port 203 is connected to a vacuum pump, which is not shown in the figure. Pressure in chamber 201 is adjusted by the amount of gas introduced and discharged.

A rotary table 204 is disposed in chamber 201. A base material holder 205 for holding base material 10 is attached to rotary table 204. Base material holder 205 is connected to a negative electrode of a bias power supply 206. A positive electrode of bias power supply 206 is grounded.

Figure 3:
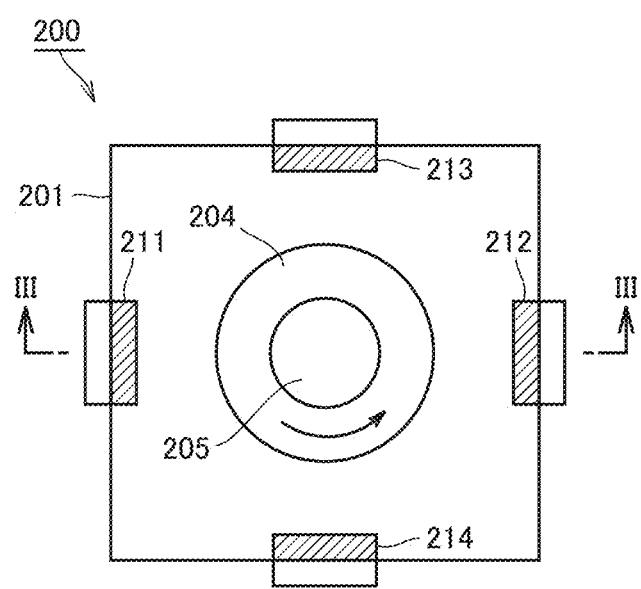
FIG. 3 is a schematic cross-sectional view illustrating an example of the configuration of a film deposition apparatus.

As shown in FIG. 3, a plurality of target materials 211, 212, 213, 214 is attached to side walls of chamber 201. As shown in FIG. 2, each of target materials 211 and 212 is connected to negative electrodes of direct current power supplies 221 and 222. Direct current power supplies 221 and 222 are variable power supplies, and their positive electrodes are grounded. The same is true for target materials 213 and 214, although not shown in FIG. 2. Specific operations will be described below.

A base material holder 205 bolds base material 10. Using a vacuum pomp, chamber 201 is adjusted to the inside pressure of $1.0 \times 10^{-4}$ Pa. While rotating rotary table 204, base material 10 is adjusted to a temperature of 500° C. by a heater (not shown) attached to deposition apparatus 200.

Ar gas is introduced from gas inlet port 202, and chamber 201 is adjusted to the inside pressure of 3.0 Pa. While maintaining the same pressure, power supply 206 gradually varies its voltage and is finally adjusted to −1000 V. A surface of base material 10 is then cleaned by ion bombardment treatment with Ar ions.

Next, a coating in the case of including second layer 22 forms second layer 22 on a surface of base material 10. For example, a TiCN layer, TiN layer, or TiCNO layer is formed on the surface of base material 10.

Next, first layer 21 is formed on the surface of base material 10 or on a surface of second layer 22. A sintered alloy containing Ti, Al and B is used as a target material. Each target material is set at a predetermined position, nitrogen gas is introduced from gas inlet port 202 to form first layer 21 while rotating rotary table 204. Forming conditions of first layer 21 are as follows.

(Forming Condition of First Layer)

Base material temperature: 400 to 650° C.
Bias voltage: −30 to −400 V
Arc current: 80 to 200 A
Reaction gas pressure: 5 to 10 Pa The base material temperature, bias voltage, arc current, and reaction gas pressure are set be constant values within the ranges described above, or varied continuously within the above ranges.

The first unit layer and second unit layer can be formed by any one of the methods (A) to (E) below.

The first unit layer and second unit layer can be formed in appropriate combinations of the methods (A) to (D) below.

(A) In the AIP method, a plurality of target materials (sintered alloys) having different compositions with each other is used.

(B) In the AIP method, bias voltage applied to base material 10 during deposition is varied within the bias voltage (−400 to −30 V) described in the forming conditions of the first layer described above.

(C) In the AIP method, a gas flow rate is varied. For example, the gas flow rate upon forming of the first unit layer can be set to 500 sccm to 2000 sccm, and the gas flow rate upon forming of the second unit layer can be set to 500 sccm to 2000 sccm.

(D) In the AIP method, base material 10 is rotated to control a rotation cycle. For example, the rotation cycle can be set to 1 rpm to 5 rpm.

Next, a coating in the case of including a third layer 23, for example, forms third layer 23 on a surface of first layer 21. For example, a TiC layer, TiN layer of TiCN layer is formed on the surface of first layer 21.

From the above, cutting tool 100 including base material 10 and coating 20 arranged on base material 10 can be manufactured.

Appendix 1

A cutting tool comprising a base material and a coating arranged on the base material, wherein
 the coating includes a first layer;
 the first layer has a multilayer structure in which a first unit layer and a second unit layer are alternately stacked;
 a thickness of the first unit layer is 2 nm or more and 50 nm or less;
 a thickness of the second unit layer is 2 nm or more and 50 nm or less;
 a thickness of the first layer is 1.0 μm or more and 20 μm or less, the first unit layer is composed of $Ti_aAl_bB_cN$, and
the second unit layer is composed of $Ti_dAl_eB_fN$,
wherein
$0.49 \leq a \leq 0.70$,
$0.19 \leq b \leq 0.40$,
$0.10 < c \leq 0.20$,
$a+b+c=1.00$,
$0.39 \leq d \leq 0.60$,
$0.29 \leq e \leq 0.50$,
$0.10 \leq f \leq 0.20$,
$d+e+f=1.00$,
$0.05 \leq a-d \leq 0.20$, and
$0.05 \leq e-b \leq 0.20$ are satisfied, and
a percentage of the number of atoms of titanium to the total number of atoms of titanium, aluminum and boron is 45% or more in the first layer.

Appendix 2

The cutting tool according to appendix 1, wherein a coefficient of friction of the first layer at 25° C. for carbon steel S50C is 0.50 or less.

Appendix 3

The cutting tool according to appendix 1 or 2, wherein a nanoindentation hardness H of the first layer at 25° C. is 25 GPa or greater.

Examples

The present embodiment will be described more specifically by way of Examples. However, the present embodiment is not restricted by these Examples.

<Fabrication of Cutting Tool>

A cutting tool is fabricated as follows and a tool life was evaluated.

<<Sample 1 to Sample 16, Samples 1-1 to 1-12>>

A cutting insert made of cemented carbide (model number: CNMG120408N manufactured by Sumitomo Electric Hardmetal Ltd.) was prepared as a base material. The cemented carbide contains WC particles (90% by mass) and Co (10% by mass). The average particle size of the WC particle is 2 μm.

A coating was formed on the aforementioned base material by using a deposition apparatus 200 having the configuration shown in FIGS. 2 and 3. First, a surface of the base material 10 was cleaned by ion bombardment treatment with Ar ions. The specific conditions of the ion bombardment treatment are as described in Embodiment 2.

Next, sintered alloys having the compositions listed in the "First unit layer" and "Second unit layer" columns in the column of "Target material composition" in Tables 1 and 2 were prepared as target materials. For example, in Sample 1, a sintered alloy with the ratio of the numbers of atoms of Ti, Al and B, "Ti:Al:B=0.45:0.40:0.15" as the target material for forming of the first unit layer and a sintered alloy with the ratio of the numbers of atoms of Ti, Al and B. "Ti:Al:B=0.35:0.50:0.15" as the target material for forming of the second unit layer, were prepared.

The target materials were set at predetermined positions in the deposition apparatus. Nitrogen gas was introduced from the gas inlet port, and the first layer was formed while rotating the rotary table. The first layer forming conditions (base material temperature, bias voltage, arc current, and reaction gas pressure) for each sample are as shown in Tables 1 and 2. A rotation speed of the rotary table was adjusted according to the film thicknesses of the first unit layer and second unit layer.

TABLE 1

| | Target material composition | | | | | | Upon first unit layer forming | | | | Upon second unit layer forming | | | |
|---|---|---|---|---|---|---|---|---|---|---|---|---|---|---|
| | First unit layer | | | Second unit | | | Base material temperature | Bias voltage | Arc current | Reaction gas pressure | Base material temperature | Bias voltage | Arc current | Reaction gas pressure |
| Sample No. | Ti | Al | B | Ti | Al | B | ° C. | V | A | Pa | ° C. | V | A | Pa |
| 1 | 0.45 | 0.40 | 0.15 | 0.35 | 0.50 | 0.15 | 550 | 100 | 200 | 5 | 550 | 100 | 80 | 5 |
| 2 | 0.65 | 0.20 | 0.15 | 0.65 | 0.30 | 0.15 | 500 | 200 | 200 | 6 | 500 | 200 | 200 | 6 |
| 3 | 0.50 | 0.30 | 0.20 | 0.45 | 0.35 | 0.20 | 400 | 50 | 200 | 9 | 400 | 50 | 180 | 9 |
| 4 | 0.55 | 0.30 | 0.15 | 0.35 | 0.50 | 0.15 | 600 | 400 | 120 | 7 | 600 | 400 | 120 | 7 |
| 5 | 0.65 | 0.20 | 0.15 | 0.55 | 0.30 | 0.15 | 650 | 150 | 150 | 7 | 650 | 150 | 150 | 7 |
| 6 | 0.65 | 0.20 | 0.15 | 0.55 | 0.25 | 0.20 | 600 | 250 | 80 | 7 | 600 | 250 | 80 | 7 |
| 7 | 0.55 | 0.30 | 0.15 | 0.50 | 0.30 | 0.20 | 550 | 30 | 150 | 5 | 550 | 30 | 150 | 5 |
| 8 | 0.50 | 0.30 | 0.20 | 0.40 | 0.40 | 0.20 | 500 | 50 | 200 | 9 | 500 | 50 | 150 | 9 |
| 9 | 0.50 | 0.30 | 0.20 | 0.40 | 0.40 | 0.20 | 650 | 50 | 80 | 6 | 650 | 50 | 200 | 6 |
| 10 | 0.65 | 0.20 | 0.15 | 0.50 | 0.30 | 0.20 | 600 | 100 | 150 | 10 | 600 | 100 | 100 | 10 |
| 11 | 0.50 | 0.30 | 0.20 | 0.40 | 0.40 | 0.20 | 500 | 200 | 200 | 10 | 500 | 200 | 100 | 10 |
| 12 | 0.55 | 0.25 | 0.20 | 0.45 | 0.35 | 0.20 | 450 | 150 | 100 | 8 | 450 | 150 | 200 | 8 |
| 13 | 0.55 | 0.25 | 0.20 | 0.50 | 0.30 | 0.20 | 550 | 150 | 100 | 9 | 550 | 150 | 100 | 9 |
| 14 | 0.55 | 0.25 | 0.20 | 0.45 | 0.35 | 0.20 | 500 | 200 | 200 | 7 | 500 | 200 | 150 | 7 |
| 15 | 0.50 | 0.30 | 0.20 | 0.40 | 0.40 | 0.20 | 500 | 100 | 200 | 7 | 500 | 100 | 150 | 7 |
| 16 | 0.55 | 0.25 | 0.20 | 0.50 | 0.30 | 0.20 | 600 | 300 | 150 | 8 | 600 | 300 | 150 | 8 |

TABLE 2

| Sample No. | Target material composition | | | | | | Upon first unit layer forming | | | | Upon second unit layer forming | | | |
|---|---|---|---|---|---|---|---|---|---|---|---|---|---|---|
| | First unit layer | | | Second unit layer | | | Base material °C. | Bias voltage V | Arc current A | Reaction gas pressure Pa | Base material °C. | Bias voltage V | Arc current A | Reaction gas pressure Pa |
| | Ti | Al | B | Ti | Al | B | | | | | | | | |
| 1-1 | 0.45 | 0.40 | 0.15 | 0.35 | 0.50 | 0.15 | 600 | 200 | 200 | 8 | 600 | 200 | 80 | 8 |
| 1-2 | 0.65 | 0.20 | 0.16 | 0.55 | 0.30 | 0.15 | 550 | 100 | 150 | 9 | 550 | 100 | 200 | 9 |
| 1-3 | 0.55 | 0.25 | 0.20 | 0.50 | 0.40 | 0.10 | 800 | 50 | 200 | 7 | 500 | 50 | 100 | 7 |
| 1-4 | 0.55 | 0.30 | 0.15 | 0.38 | 0.38 | 0.24 | 500 | 400 | 200 | 8 | 500 | 400 | 150 | 8 |
| 1-5 | 0.55 | 0.25 | 0.20 | 0.55 | 0.30 | 0.15 | 650 | 100 | 120 | 10 | 650 | 100 | 150 | 10 |
| 1-6 | 0.55 | 0.25 | 0.20 | 0.40 | 0.40 | 0.20 | 550 | 200 | 100 | 6 | 550 | 200 | 150 | 6 |
| 1-7 | 0.55 | 0.30 | 0.15 | 0.50 | 0.30 | 0.20 | 400 | 50 | 200 | 7 | 400 | 50 | 80 | 7 |
| 1-8 | 0.55 | 0.25 | 0.20 | 0.40 | 0.40 | 0.20 | 450 | 50 | 200 | 10 | 450 | 8 | 100 | 10 |
| 1-9 | 0.65 | 0.20 | 0.15 | 0.55 | 0.30 | 0.15 | 500 | 150 | 80 | 7 | 500 | 150 | 80 | 7 |
| 1-10 | 0.45 | 0.40 | 0.15 | 0.35 | 0.50 | 0.15 | 550 | 30 | 200 | 5 | 550 | 30 | 200 | 5 |
| 1-11 | 0.55 | 0.25 | 0.20 | 0.40 | 0.40 | 0.20 | 450 | 50 | 80 | 8 | 450 | 50 | 200 | 8 |
| 1-12 | 0.50 | 0.45 | 0.05 | 0.45 | 0.50 | 0.05 | 500 | 100 | 120 | 5 | 500 | 100 | 150 | 5 |

<Evaluation>
<<Composition of Coating>>
The coating of each sample was measured regarding compositions of the first unit layer and second unit layer, the thickness and the number of stacking of the first unit layer, the thickness and the number of stacking of the second unit layer, the thickness and the number of stacking of the first layer, the percentage of the number of atoms of titanium to the total number of atoms of titanium, aluminum and boron (denoted as the "Ti content" in Table 1) in the first layer, coefficient of friction of the first layer for carbon steel S50, and nanoindentation hardness H of the first layer (denoted as "Hardness H" in Table 1). The measurement methods for each item is as described in Embodiment 1. The results are shown in Tables 3 and 4.

TABLE 3

| Sample No. | First unit layer composition | | | Second unit layer composition | | | a-d | e-b | First unit layer | | Second unit layer | |
|---|---|---|---|---|---|---|---|---|---|---|---|---|
| | a | b | c | d | e | f | | | Thickness (nm) | Number of stacking | Thickness (nm) | Number of stacking |
| 1 | 0.49 | 0.40 | 0.11 | 0.39 | 0.50 | 0.11 | 0.10 | 0.10 | 20 | 154 | 6 | 154 |
| 2 | 0.70 | 0.19 | 0.11 | 0.60 | 0.29 | 0.11 | 0.10 | 0.10 | 18 | 231 | 21 | 231 |
| 3 | 0.50 | 0.30 | 0.20 | 0.45 | 0.35 | 0.20 | 0.05 | 0.05 | 37 | 224 | 30 | 224 |
| 4 | 0.61 | 0.27 | 0.12 | 0.41 | 0.47 | 0.12 | 0.20 | 0.20 | 10 | 105 | 9 | 105 |
| 5 | 0.66 | 0.19 | 0.15 | 0.52 | 0.37 | 0.11 | 0.14 | 0.18 | 7 | 286 | 7 | 286 |
| 6 | 0.69 | 0.20 | 0.11 | 0.57 | 0.29 | 0.18 | 0.12 | 0.09 | 2 | 250 | 2 | 250 |
| 7 | 0.59 | 0.29 | 0.12 | 0.52 | 0.36 | 0.12 | 0.07 | 0.07 | 50 | 200 | 50 | 200 |
| 8 | 0.55 | 0.27 | 0.18 | 0.43 | 0.41 | 0.16 | 0.12 | 0.14 | 22 | 205 | 17 | 205 |
| 9 | 0.57 | 0.26 | 0.17 | 0.42 | 0.41 | 0.17 | 0.15 | 0.15 | 8 | 419 | 35 | 419 |
| 10 | 0.66 | 0.23 | 0.11 | 0.51 | 0.35 | 0.14 | 0.15 | 0.12 | 18 | 367 | 12 | 367 |
| 14 | 0.52 | 0.35 | 0.13 | 0.43 | 0.42 | 0.15 | 0.09 | 0.07 | 28 | 167 | 14 | 167 |
| 12 | 0.58 | 0.23 | 0.19 | 0.45 | 0.36 | 0.19 | 0.13 | 0.13 | 11 | 273 | 22 | 273 |
| 13 | 0.60 | 0.24 | 0.16 | 0.50 | 0.37 | 0.13 | 0.10 | 0.13 | 4 | 667 | 5 | 667 |
| 14 | 0.60 | 0.22 | 0.18 | 0.48 | 0.34 | 0.18 | 0.12 | 0.12 | 42 | 67 | 33 | 67 |
| 15 | 0.53 | 0.32 | 0.15 | 0.47 | 0.41 | 0.12 | 0.06 | 0.09 | 29 | 89 | 16 | 89 |
| 18 | 0.59 | 0.26 | 0.15 | 0.53 | 0.32 | 0.15 | 0.06 | 0.06 | 15 | 107 | 13 | 107 |

| Sample No. | First layer | | | | Cutting test |
|---|---|---|---|---|---|
| | Thickness (μm) | Number of stacking | Coefficient of friction | Hardness H (GPa) | Cutting time (minutes) |
| 1 | 4.0 | 308 | 0.38 | 28 | 36 |
| 2 | 9.0 | 462 | 0.45 | 26 | 39 |
| 3 | 15.0 | 446 | 0.20 | 31 | 48 |
| 4 | 2.0 | 210 | 0.39 | 29 | 33 |
| 5 | 4.0 | 571 | 0.38 | 32 | 42 |
| 6 | 1.0 | 500 | 0.25 | 26 | 30 |
| 7 | 20.0 | 400 | 0.41 | 29 | 36 |
| 8 | 8.0 | 410 | 0.31 | 29 | 42 |
| 9 | 18.0 | 838 | 0.29 | 34 | 39 |
| 10 | 11.0 | 734 | 0.35 | 38 | 42 |
| 14 | 7.0 | 334 | 0.50 | 26 | 30 |
| 12 | 9.0 | 546 | 0.25 | 27 | 42 |
| 13 | 6.0 | 1334 | 0.60 | 30 | 30 |
| 14 | 5.0 | 134 | 0.33 | 25 | 36 |
| 15 | 4.0 | 178 | 0.38 | 28 | 36 |
| 18 | 3.0 | 214 | 0.31 | 23 | 36 |

TABLE 4

| Sample No. | First unit layer composition | | | Second unit layer composition | | | a-d | e-b | First unit layer | | Second unit layer | |
|---|---|---|---|---|---|---|---|---|---|---|---|---|
| | a | b | c | d | e | f | | | Thickness (μm) | Number of stacking | Thickness (nm) | Number of stacking |
| 1-1 | 0.48 | 0.42 | 0.10 | 0.38 | 0.51 | 0.11 | 0.10 | 0.09 | 32 | 70 | 11 | 70 |
| 1-2 | 0.71 | 0.17 | 0.12 | 0.61 | 0.26 | 0.13 | 0.10 | 0.09 | 15 | 211 | 23 | 211 |
| 1-3 | 0.59 | 0.26 | 0.15 | 0.53 | 0.38 | 0.09 | 0.06 | 0.12 | 28 | 383 | 19 | 383 |
| 1-4 | 0.56 | 0.32 | 0.12 | 0.41 | 0.38 | 0.21 | 0.15 | 0.06 | 41 | 41 | 32 | 41 |
| 1-5 | 0.61 | 0.24 | 0.15 | 0.57 | 0.32 | 0.11 | 0.04 | 0.08 | 14 | 250 | 22 | 250 |
| 1-6 | 0.62 | 0.20 | 0.18 | 0.41 | 0.40 | 0.19 | 0.21 | 0.20 | 19 | 135 | 25 | 136 |
| 1-7 | 0.55 | 0.34 | 0.11 | 0.50 | 0.38 | 0.12 | 0.05 | 0.04 | 25 | 424 | 8 | 424 |
| 1-8 | 0.61 | 0.20 | 0.19 | 0.45 | 0.43 | 0.12 | 0.16 | 0.23 | 10 | 667 | 5 | 667 |
| 1-9 | 0.86 | 0.22 | 0.12 | 0.55 | 0.31 | 0.14 | 0.11 | 0.09 | 1 | 350 | 1 | 350 |
| 1-10 | 0.50 | 0.36 | 0.14 | 0.41 | 0.45 | 0.14 | 0.09 | 0.09 | 55 | 209 | 55 | 209 |
| 1-13 | 0.55 | 0.29 | 0.16 | 0.41 | 0.40 | 0.19 | 0.44 | 0.11 | 8 | 212 | 25 | 212 |
| 1-12 | 0.52 | 0.44 | 0.04 | 0.45 | 0.51 | 0.04 | 0.07 | 0.07 | 95 | 19 | 120 | 19 |

| Sample No. | First layer | | | | Cutting test |
|---|---|---|---|---|---|
| | Thickness (μm) | Number of stacking | Coefficient of friction | Hardness H (GPS) | Cutting time (minutes) |
| 1-1 | 3.0 | 140 | 0.46 | 25 | 21 |
| 1-2 | 8.0 | 422 | 0.43 | 24 | 15 |
| 1-3 | 18.0 | 766 | 0.59 | 34 | 21 |
| 1-4 | 3.0 | 82 | 0.37 | 20 | 6 |
| 1-5 | 9.0 | 500 | 0.42 | 26 | 12 |
| 1-6 | 6.0 | 272 | 0.30 | 25 | 16 |
| 1-7 | 14.0 | 848 | 0.43 | 25 | 12 |
| 1-8 | 10.0 | 1334 | 0.47 | 29 | 18 |
| 1-9 | 0.7 | 700 | 0.35 | 32 | 3 |
| 1-10 | 23.0 | 418 | 0.32 | 27 | 9 |
| 1-13 | 7.0 | 424 | 0.29 | 28 | 15 |
| 1-12 | 4.0 | 38 | 0.69 | 33 | 15 |

<<Cutting Test>>

A cutting test was carried out by using the cutting tool of each sample under the following conditions, and a cutting time (minutes) until the width of crater wear reached 0.3 mm or more was measured. The longer the cutting time, the more hardly the cutting tool poses the crater wear, thereby determined to have a longer tool life. The results are shown in the "Cutting test" column of Tables 3 and 4.

(Cutting Conditions)
Workpiece: Stainless steel
Cutting speed: 150 m/min
Feed rate: 0.2 mm/rev
Depth of cut: 1.0 mm
Wet method The above cutting conditions correspond to those for turning of stainless steel.

<Considerations>

The cutting tools of Sample 1 to Sample 16 correspond to Examples. The cutting tools of Sample 1-1 to Sample 1-12 correspond to Comparative Examples. The cutting tools of Sample 1 to Sample 16 (Examples) were confirmed to have longer tool lives than the cutting tools of Sample 1-1 to Sample 1-12 (Comparative Examples).

The embodiments and Examples of the present disclosure have been explained as described above, however appropriate combinations of each aforementioned embodiment and the configurations of Examples as well as variations thereof in various ways, have been contemplated from the beginning.

The embodiments and Examples disclosed herein are illustrative in all respects and should be considered not restrictive. The scope of the present disclosure is indicated by the claims, not by the aforementioned embodiments and Examples, and is intended to include the meaning equivalent to the scope of the claims and all modifications within the scope.

REFERENCE SIGNS LIST

1 first unit layer, 2 second unit layer, 10 base material, 20 coating, 21 first layer, 22 second layer, 23 third layer, 100 cutting tool 200 deposition apparatus, 201 chamber, 202 gas inlet port. 203 gas exhaust port, 204 rotary table, 205 base material holder, 206 bias power supply, 211, 212, 213, and 214 target materials, 221 and 222 direct current power supply.

The invention claimed is:

1. A cutting tool comprising a base material and a coating arranged on the base material, wherein
   the coating comprises a first layer;
   the first layer has a multilayer structure in which a first unit layer and a second unit layer are alternately stacked;
   a thickness of the first unit layer is 2 nm or more and 50 nm or less;
   a thickness of the second unit layer is 2 nm or more and 50 nm or less;
   a thickness of the first layer is 1.0 μm or more and 20 μm or less,
   the first unit layer is composed of $Ti_aAl_bB_cN$, and
   the second unit layer is composed of $Ti_dAl_eB_fN$, wherein
   $0.49 \leq a \leq 0.70$,
   $0.19 \leq b \leq 0.40$,
   $0.10 < c \leq 0.20$,
   $a+b+c=1.00$,
   $0.39 \leq d \leq 0.60$, $0.29 \leq e \leq 0.50$,
$0.12 \leq f \leq 0.20$,
$d+e+f=1.00$,
$0.05 \leq a-d \leq 0.20$, and
$0.05 \leq e-b \leq 0.20$ are satisfied, and
a percentage of the number of atoms of titanium to the total number of atoms of titanium, aluminum and boron is 45% or more in the first layer.

2. The cutting tool according to claim 1, wherein a coefficient of friction of the first layer for carbon steel S50C at 25° C. is 0.50 or less.

3. The cutting tool according to claim 1, wherein a nanoindentation hardness H of the first layer at 25° C. is 25 GPa or greater.

* * * * *